United States Patent
Nakashima

(10) Patent No.: US 6,531,770 B2
(45) Date of Patent: Mar. 11, 2003

(54) ELECTRONIC PART UNIT ATTACHED TO A CIRCUIT BOARD AND INCLUDING A COVER MEMBER COVERING THE ELECTRONIC PART

(75) Inventor: Hajime Nakashima, Omiya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/994,621

(22) Filed: Nov. 28, 2001

(65) Prior Publication Data

US 2002/0063326 A1 May 30, 2002

(30) Foreign Application Priority Data

Nov. 28, 2000 (JP) .......................... 2000-361515

(51) Int. Cl.⁷ .............................................. H01L 23/12
(52) U.S. Cl. .................. 257/704; 257/713; 257/717; 257/720; 257/723; 257/738; 257/779; 257/787; 361/704; 361/709; 361/711; 361/719
(58) Field of Search .................. 257/704, 705, 257/706, 707, 678, 687, 712, 713, 717, 720, 723, 724, 734, 737, 738, 779, 780, 784, 787; 361/600, 679, 688, 704, 709, 710, 711, 717, 718, 719

(56) References Cited

U.S. PATENT DOCUMENTS 5,956,576 A * 9/1999 Toy et al. .................. 438/125
6,218,730 B1 * 4/2001 Toy et al. .................. 257/704
6,285,079 B1 * 9/2001 Kunikiyo .................. 257/737

FOREIGN PATENT DOCUMENTS

| JP | 62-62545 | * | 3/1987 |
| JP | 4-92457 | * | 3/1992 |
| JP | 4-155853 | * | 5/1992 |
| JP | 4-157757 | * | 5/1992 |
| JP | 11-121640 | * | 4/1999 |
| JP | 7-202060 | | 8/1999 |
| JP | 11-307679 | | 11/1999 |
| JP | 2002-93994 | | 3/2002 |

* cited by examiner

Primary Examiner—Albert W. Paladini
Assistant Examiner—Alonzo Chambliss
(74) Attorney, Agent, or Firm—Oblon, Spivak, McClelland, Maier & Neustadt, P.C.

(57) ABSTRACT

An electronic part unit comprises an electronic part body which has a semiconductor chip and a plurality of external connection electrodes electrically connected to the semiconductor chip and in which the semiconductor chip is encapsulated such that the external connection electrodes remain exposed in a bottom surface of the electronic part body serving as a mounting surface opposed to the printed circuit board, and a cover member covering the electronic part body except for the mounting surface. The cover member has a shape defining a space which receives an adhesive around a side surface of the electronic part body to bond the electronic part body and the cover member to the printed circuit board.

24 Claims, 6 Drawing Sheets

ELECTRONIC PART UNIT ATTACHED TO A CIRCUIT BOARD AND INCLUDING A COVER MEMBER COVERING THE ELECTRONIC PART

CROSS-REFERENCE TO RELATED APPLICATIONS

This application is based upon and claims the benefit of priority from the prior Japanese Patent Application No. 2000-361515, filed Nov. 28, 2000, the entire contents of which are incorporated herein by reference.

BACKGROUND OF THE INVENTION

1. Field of the Invention

The present invention generally relates to an electronic part unit and circuit board apparatus to be incorporated in an electronic appliance, and more particularly to an electronic part unit and circuit board apparatus to be incorporated in a wireless communication terminal such as a portable telephone.

2. Description of the Related Art

An electronic part unit shown in FIG. 11 is conventionally known, which comprises an electronic part body 1 of a structure called a BGA (Ball Grid Array). The electronic part body 1 includes a carrier substrate 1B and a semiconductor chip 1A which is bonded to the carrier substrate 1B by a die bonding paste 1C. The semiconductor chip 1A on the carrier substrate 1B is encapsulated with a resin material 1G in a state where electrodes 1J on the carrier substrate 1B are connected to electrodes 1K on the semiconductor chip 1A by bonding wires 1E. The carrier substrate 1B has electrodes 1L formed on a rear surface thereof opposite to the semiconductor chip 1A and connected via through-holes 1D to the electrodes 1K, and a solder resist 1H surrounding the electrodes 1L so that solder balls 1F can be selectively attached to the electrodes 1L.

The electronic part body 1 described above is mounted, for example, on a printed circuit board 2 as shown in FIG. 12. To be more specific, the solder balls 1F are used for electrically connecting the electrodes 1L on the carrier substrate 1B to lead electrodes 2A on the printed circuit board 2. The printed circuit board 2 and the carrier substrate 1B are bonded to each other by an adhesive 3 made of an epoxy resin or the like filled in a space therebetween.

However, in the circuit board apparatus formed of the electronic part body 1 and the printed circuit board 2 integrated as described above, there is a possibility that the solder-contacts will be broken when the electronic part body 1 and the printed circuit board 2 are peeled off from each other due to a mechanical stress concentrated in the boundary therebetween, if the bonding area of the adhesive 3 is not sufficient. Further, the adhesive 3 tends to leak into the area surrounding the electronic part body 1 during the process of applying the adhesive 3 to the space between the electronic part body 1 and the printed circuit board 2, and to be undesirably attached to other electronic parts which should not be stained by the adhesive 3. Thus, it becomes necessary for the electronic part body 1 to be appropriately distanced from the other electronic parts. As a result, increase in the electronic part density of the printed circuit board is restricted.

The particular situation is not limited to the electronic part unit using the electronic part body 1 of the BGA structure. Similar difficulties also arise in electronic part units using various electronic parts, for example, of a structure called a QON (Quad Outline Non-lead).

BRIEF SUMMARY OF THE INVENTION

An object of the present invention, which has been achieved in view of the situation described above, is to provide an electronic part unit and circuit board apparatus of a high reliability in which the mounting strength of an electronic part body is improved.

According to a first aspect of the present invention, there is provided an electronic part unit to be mounted on a printed circuit board, which unit comprises: an electronic part body which has a semiconductor chip and a plurality of external connection electrodes electrically connected to the semiconductor chip and in which the semiconductor chip is encapsulated such that the external connection electrodes remain exposed in a bottom surface of the electronic part body serving as a mounting surface opposed to the printed circuit board; and a cover member covering the electronic part body except for the mounting surface; wherein the cover member has a shape defining a space which receives an adhesive around a side surface of the electronic part body to bond the electronic part body and the cover member to the printed circuit board.

According to a second aspect of the present invention, there is provided a circuit board apparatus which comprises a printed circuit board; an electronic part body which has a semiconductor chip and a plurality of external connection electrodes electrically connected to the semiconductor chip and which is mounted on the printed circuit board, and in which the semiconductor chip is encapsulated such that the external connection electrodes remain exposed in a bottom surface of the electronic part body serving as a mounting surface opposed to the printed circuit board; a cover member covering the electronic part body except for the mounting surface; and an adhesive received in a space which is defined around a side surface of the electronic part body by the shape of the cover member to bond the electronic part body and the cover member to the printed circuit board.

With the electronic part unit and the circuit board apparatus, the shape of the cover member defines a space which receives an adhesive around the side surface of the electronic part body to bond the electronic part body and the cover member to the printed circuit board. Therefore, sufficient bonding strength can be obtained by improvement of the bonding area. Further, since the cover member can be used for completely sealing the adhesive on at least a side where another electronic part neighbors to prevent leakage of the adhesive, the electronic-part density of the printed circuit board can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An electronic part unit according to a first embodiment of the present invention will now be described in detail with reference to the accompanying drawings.

Figure 1:
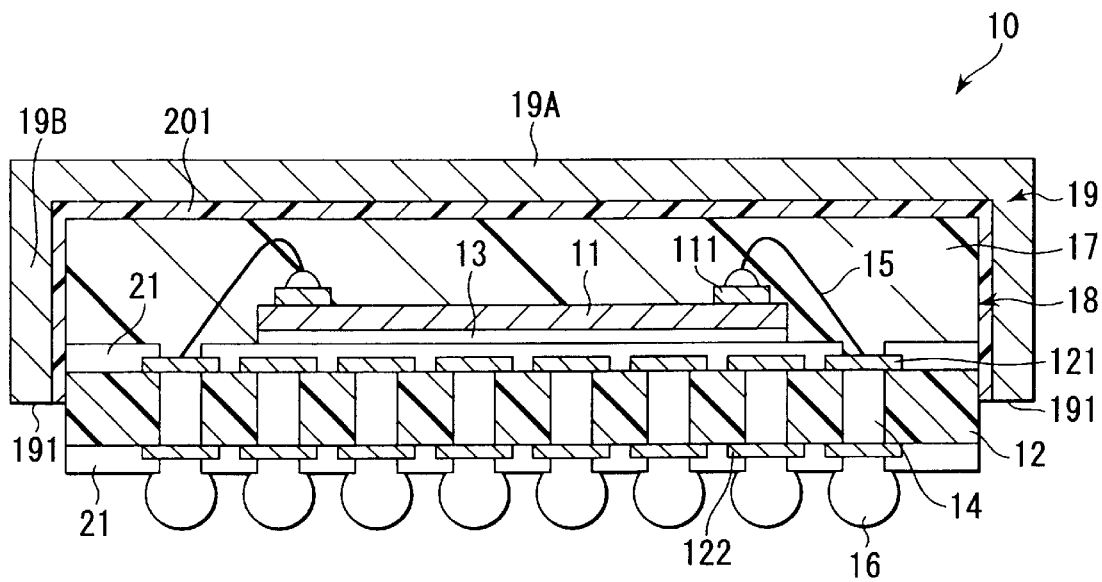
FIG. 1 is a cross sectional view showing an electronic part unit according to a first embodiment of the present ivention.

FIG. 1 shows the electronic part unit 10. The electronic part unit 10 comprises an electronic part body 18 which is a square chip module having a structure, for example, of a BGA (Ball Grid Array). In the electronic part body 18, a semiconductor chip 11 such as an integrated circuit is bonded to a carrier substrate 12 by a die bonding paste 13. A plurality of electrodes 111 on the semiconductor chip 11 are connected respectively to a plurality of electrodes 121 on the carrier substrate 12 by bonding wires 15. These electrodes 121 on the carrier substrate 12 are electrically connected via through-holes 14 to a plurality of electrodes 122 formed on the rear side, and solder balls 16 are selectively attached as bumps to the electrodes 122 surrounded by a solder resist 21. The semiconductor chip 11 is encapsulated or sealed with a resin material 17 on the carrier substrate 12. The electronic part unit 10 further comprises a reinforcing cover member 19 which has a shape like a cap and covers the electronic part body 18 such that the mounting surface remains exposed. The cover member 19 is made of, for example, a metallic material or a resin material, and fixed to the electronic part body 18 by using an adhesive 201. The cover member 19 of the metallic material serves as a heat sink for dissipating the heat emitted from the semiconductor chip 11.

The cover member 19 includes a plate section 19A covering the top surface of the electronic part body 18 and a side-wall section 19B extending downward from the plate section 19A along the side surface of the electronic part body 18. The rim 191 of the cover member 19 is located to be higher than the bottom surface of the electronic part body 18, serving as the mounting surface, so as to form a step with respect to the mounting surface of the electronic part body 18.

Figure 2:
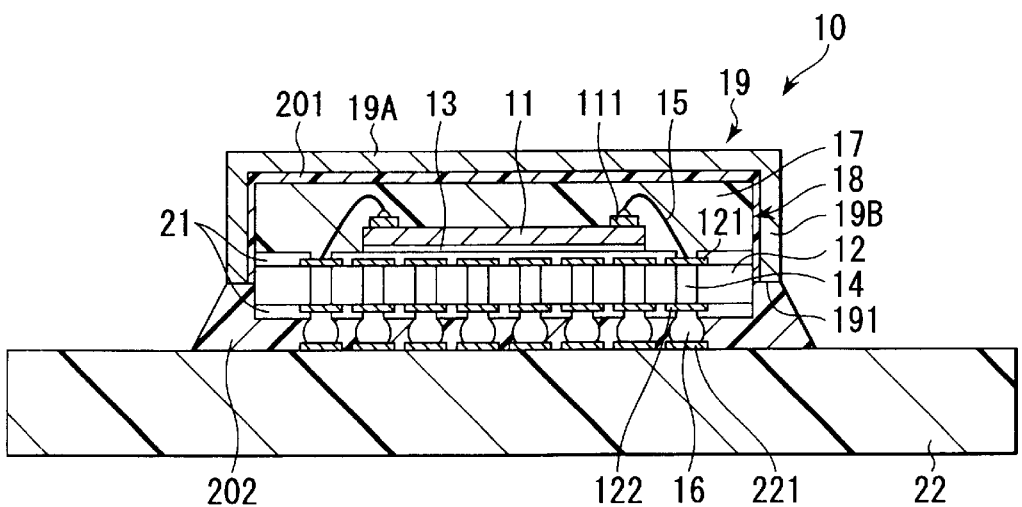
FIG. 2 is a cross sectional view showing a circuit board apparatus having the electronic part unit shown in FIG. 1 mounted thereon.

FIG. 2 shows a circuit board apparatus having the electronic part unit mounted thereon. The electronic part unit 10 is placed on a printed circuit board 22, and mounted by a reflow soldering in which the solder balls 16 are connected to desired connection electrodes 221 of the printed circuit board 22 with a solder paste (not shown) interposed therebetween. Under this condition, an adhesive 202 formed of, for example, an epoxy resin is loaded to at least two perpendicular sides of the mounting surface of the electronic part body 18 below the rim 191 of the cover member 19. Thus, the adhesive 202 is filled in the space which is created to surround solder balls 16 between the electronic part body 18 and the printed circuit board 22 according to the thickness of solder balls 16, and also in the space defined by the rim 191 of the cover member 19, the side surface of the electronic part body 18 and the printed circuit board 22 so as to bond the electronic part body 18 and the cover member 19 to the printed circuit board 22.

In a case where a mechanical stress is applied to the electronic part unit 10, the stress is dispersed into the entire boundary between electronic part body 18 and the printed circuit board 22 by means of the adhesive 202. This alleviates concentration of the mechanical stress to the solder contacts so as to secure the initial state of mounting.

In the first embodiment described above, the electronic part unit 10 comprises the electronic part body 18 and the cover member 19. The electronic part body 18 has the semiconductor chip 11 and the plurality of external connection electrodes 122 electrically connected to the semiconductor chip 11. The semi-conductor chip 11 is encapsulated such that the external connection electrodes 122 remain exposed in the bottom surface of the electronic part body 18, which serves as a mounting surface opposed to the printed circuit board 22. The cover member 19 is fixed to and covers the electronic part body 18 except for the mounting surface. The cover member 19 has a shape defining a space which receives an adhesive 202 around the side surface of the electronic part body 18 so as to bond the electronic part body 18 and the cover member 19 to the printed circuit board 22. To be more specific, the plate section 19A of the cover member 19 covers the top surface of the electronic part body 18, and the side-wall section 19B of the cover member 19 extends downward from the plate section 19A along the side surface of the electronic part body 18 so as to form a step in the mounting surface of the electronic part unit 10. It follows that the rigidity of the electronic part unit 10 is reinforced by the cover member 19, and a sufficient bonding area is secured by the adhesive 202 received in a space defined by the rim 191, the side surface of the electronic body 18, and the printed circuit board 22. Since the toughness against the mechanical stress is improved in the adhesive boundary between the electronic part body 18 and the printed circuit board 22, the mounting of a high reliability and a high accuracy can be realized.

In the electronic part unit 10 and the circuit board apparatus described above, the rim 191 of the cover member 19 is located to be higher than the mounting surface of the electronic part body 18. However, the present invention is not limited to the particular construction. For example, it is possible to form the rim 191 of the cover member 19 substantially flush with the bottom surface of the carrier substrate 12. This particular construction also permits producing substantially the same effect.

The present invention is not limited to the embodiment described above and can be constructed as shown in FIGS. 3 to 10. In FIGS. 3 to 10, portions similar to those shown in FIGS. 1 and 2 are denoted by the same reference numerals, and the detailed descriptions thereof are omitted.

Figure 3:
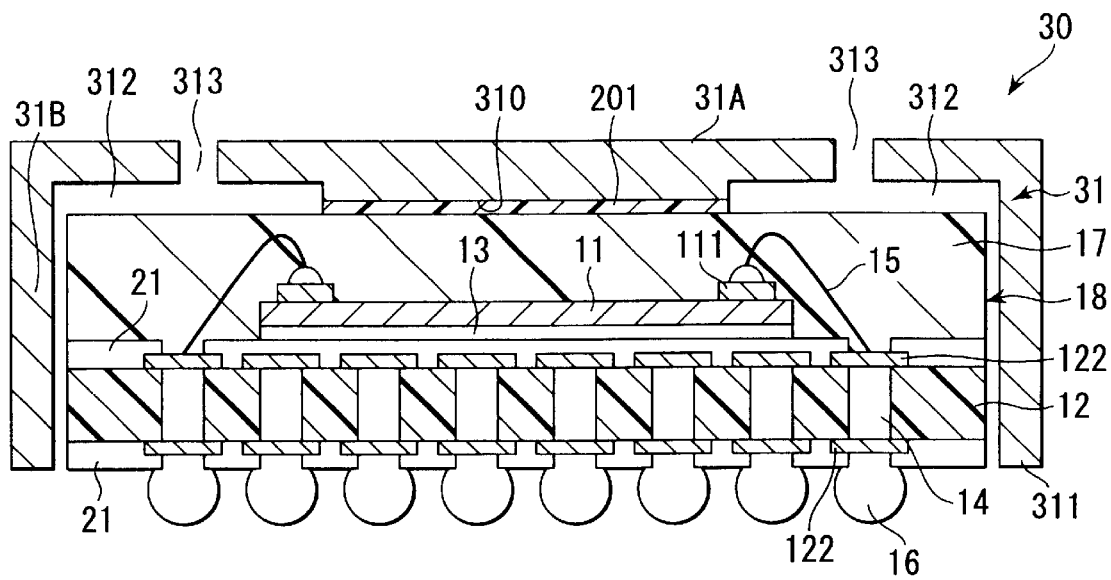
FIG. 3 is a cross sectional view showing an electronic part unit according to a second embodiment of the present invention.

FIG. 3 shows an electronic part unit 30 according to a second embodiment of the present invention. The electronic part unit 30 comprises a cover member 31 which covers the electronic part body 18 such that the mounting surface remains exposed. The cover member 31 includes a plate section 31A covering the top surface of the electronic part body 18 and a side-wall section 31B extending downward from the plate section 31A along the side surface of the electronic part body 18. The rim 311 of the cover member 31 is flush with the bottom surface of the electronic part body 18. Further, the plate section 31A includes an attachment portion 310 protruding toward the electronic part body 18. The attachment portion 310 is bonded to the top surface of the electronic part body 18 by an adhesive 201.

In the electronic part unit 30, a space 312 is created between the cover member 31 and the electronic part boy 18 around the attachment portion 310 bonded to the top surface of the electronic part body 18, and a plurality of air holes 313 are formed in the plate section 31A of the cover member 31 to release air contained in the space 312.

In the electronic part unit 30, a space 312 is created between the cover member 31 and the electronic part body 18 around the attachment portion 311 bonded to the top surface of the electronic part body 18, and a plurality of air holes 313 are formed in the plate section 31A of the cover member 31 to release air contained in the space 312.

Figure 4:
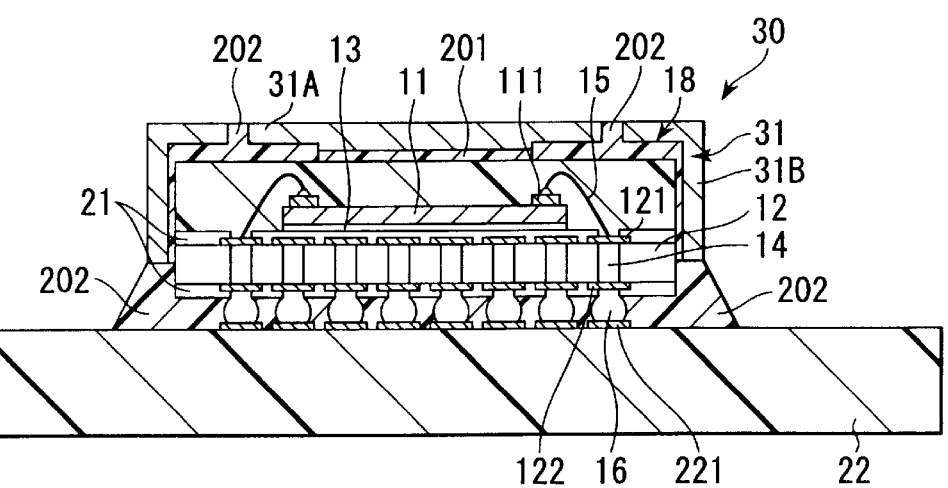
FIG. 4 is a cross sectional view showing a circuit board apparatus having the electronic part unit shown in FIG. 3 mounted thereon.
Figure 5:
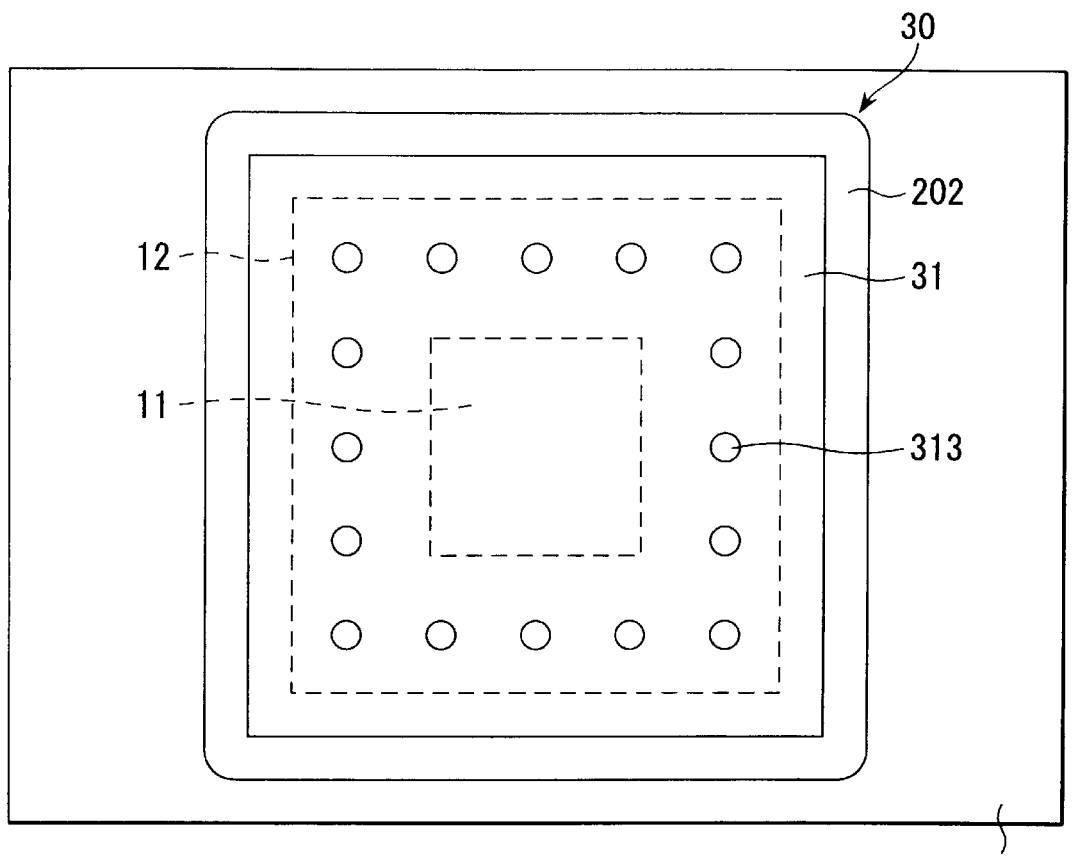
FIG. 5 is a plan view showing the outer appearance of the circuit board apparatus shown in FIG. 4.

The electronic part unit 30 is mounted on the printed circuit board 22 in a state where the cover member 31 and the electronic part body 18 are assembled in one module as shown in FIGS. 4 and 5. That is, the electronic part unit 30 is placed on the printed circuit board 22, and mounted by a reflow soldering in which the solder balls 16 are connected to desired connection electrodes 221 of the printed circuit board 22 with a solder paste (not shown) interposed therebetween. Under this condition, an adhesive 202 formed of, for example, an epoxy resin is loaded to at least two perpendicular sides of the mounting surface of the electronic part body 18 below the rim 311 of the cover member 31. Thus, the adhesive 202 is filled in a space surrounding the solder balls 16 between the electronic part body 18 and the printed circuit board 22, in a space between the rim 311 of the cover member 31 and the printed circuit board 22, and in the space 312 between the cover member 31 and the electronic part body 18 so as to bond the electronic part body 18 and the cover member 31 to the printed circuit board 22. When the adhesive 202 is loaded, it is allowed to permeate toward air holes 313 and filled in the space 312 between the cover member 31 and the electronic part body 18.

In the second embodiment described above, the adhesive 202 is additionally filled in the space 312 so as to bond the electronic part body 18 and the cover member 19 to the printed circuit board 22. In this case, the rigidity of the electronic part unit 10 is further reinforced while securing a sufficient bonding area. Accordingly, the toughness against the mechanical stress is improved in the adhesive boundary between the electronic part body 18 and the printed circuit board 22. Thus, the mounting of a high reliability and a high accuracy can be realized.

Figure 6:
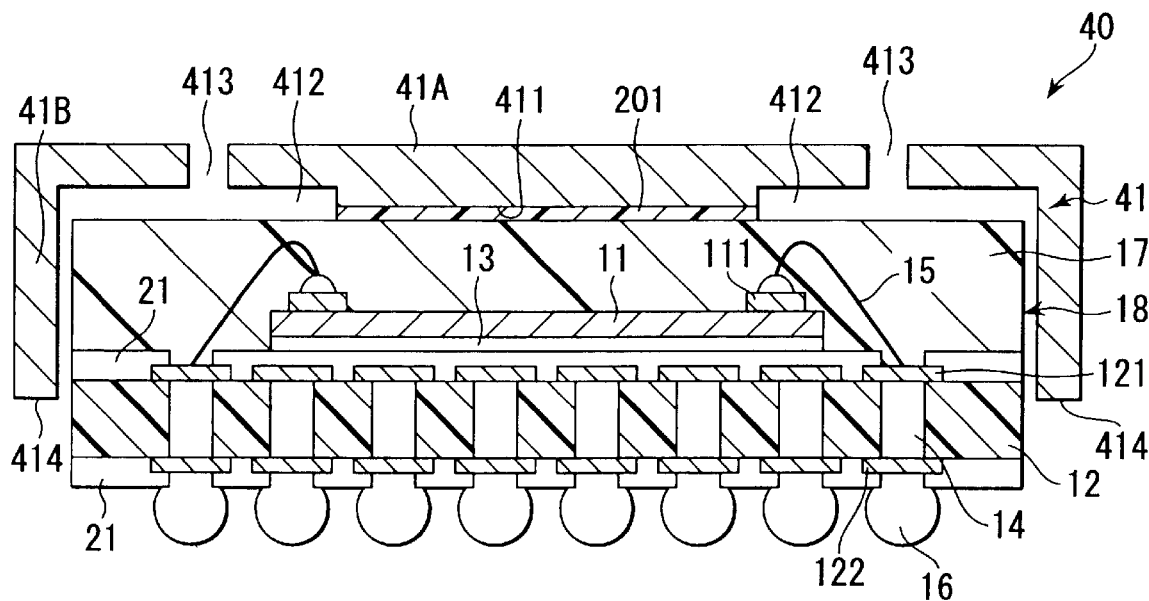
FIG. 6 is a cross sectional view showing an is electronic part unit according to a third embodiment of the present invention.

FIG. 6 shows an electronic part unit 40 according to a third embodiment of the present invention. The electronic part unit 40 comprises a cover member 41 covering such that the mounting surface remains exposed. The cover member 41 includes a plate section 41A covering the top surface of the electronic part body 18 and a side-wall section 41B extending downward from the plate section 41A along the side surface of the electronic part body 18. The rim 411 of the cover member 41 is located to be higher than the bottom surface of the electronic part body 18. Further, the plate section 41A includes an attachment portion 411 protruding toward the electronic part body 18. The attachment portion 411 is bonded to the top surface of the electronic part body 18 by an adhesive 201.

In the electronic part unit 40, a space 412 is created between the cover member 41 and the electronic part body 18 around the attachment portion 411 bonded to the top surface of the electronic part body 18, and a plurality of air holes 413 are formed in the plate section 41A of the cover member 41 to release air contained in the space 412.

Figure 7:
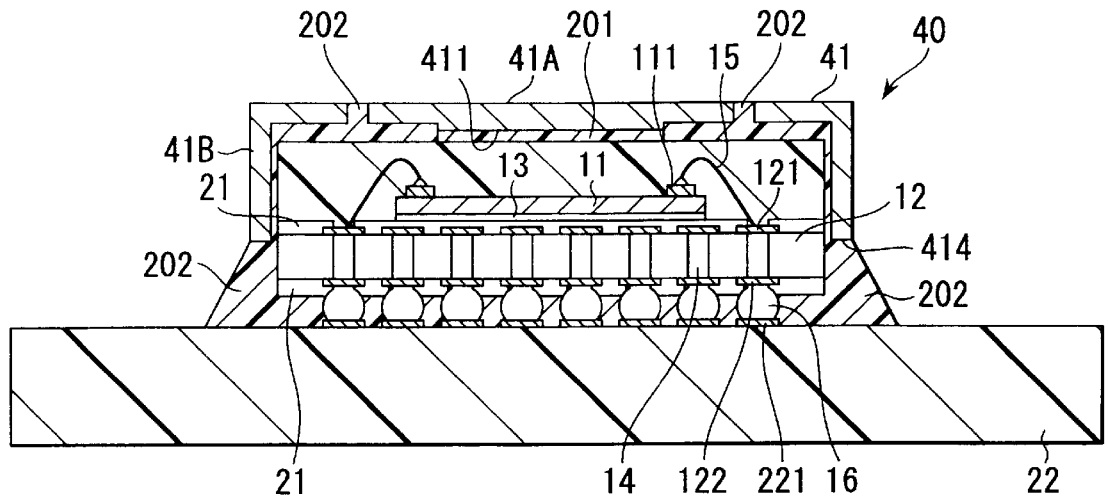
FIG. 7 is a cross sectional view showing a circuit board apparatus having the electronic part unit shown in FIG. 6 mounted thereon.

The electronic part unit 40 is mounted on the printed circuit board 22 in a state where the cover member 41 and the electronic part body 18 are assembled in one module as shown in FIG. 7. That is, the electronic part unit 40 is placed on the printed circuit board 22, and mounted by a reflow soldering in which the solder balls 16 are connected to desired connection electrodes 221 of the printed circuit board 22 with a solder paste (not shown) interposed therebetween. Under this condition, an adhesive 202 formed of, for example, an epoxy resin is loaded to at least two perpendicular sides of the mounting surface of the electronic part body 18 below the rim 411 of the cover member 41. Thus, the adhesive 202 is filled in a space surrounding the solder balls 16 between the electronic part body 18 and the printed circuit board 22, in a space defined by the rim 411 of the cover member 41, the side surface of the electronic part body 18 and the printed circuit board 22, and in the space 412 between the cover member 41 and the electronic part body 18 so as to bond the electronic part body 18 and the cover member 41 to the printed circuit board 22. When the adhesive 202 is loaded, it is allowed to permeate toward air holes 413 and filled in the space 412 between the cover member 41 and the electronic part body 18.

In the third embodiment described above, the electronic part unit 40 comprises the electronic part body 18 and the cover member 41. The electronic part body 18 has the semiconductor chip 11 and the plurality of electrodes 122 electrically connected to the semiconductor chip 11. The semiconductor chip 11 is encapsulated such that the electrodes 122 remain exposed in the bottom surface of the electronic part body 18, which serves as a mounting surface opposed to the printed circuit board 22. The cover member 41 is fixed to and covers the electronic part body 18 except for the mounting surface. The cover member 41 has a shape defining a space which receives an adhesive 202 around the side surface of the electronic part body 18 so as to bond the electronic part body 18 and the cover member 41 to the printed circuit board 22. To be more specific, the plate section 41A of the cover member 41 covers the top surface of the electronic part body 18, and the side-wall section 41B of the cover member 41 extends downward from the plate section 41A along the side surface of the electronic part body 18 so as to form a step in the mounting surface of the electronic part unit 40. It follows that the rigidity of the electronic part unit 40 is reinforced by the cover member 41, and a sufficient bonding area is secured by the adhesive 202 received in a space defined by the rim 414, the side surface of the electronic body 18, and the printed circuit board 22.

The adhesive 202 is additionally filled in the space 412 so as to bond the electronic part body 18 and the cover member 19 to the printed circuit board 22. In this case, the rigidity of the electronic part unit 40 is further reinforced while securing a sufficient bonding area. Accordingly, the toughness against the mechanical stress is improved in the adhesive boundary between the electronic part body 18 and the printed circuit board 22. Thus, the mounting of a high reliability and a high accuracy can be realized.

Figure 8:
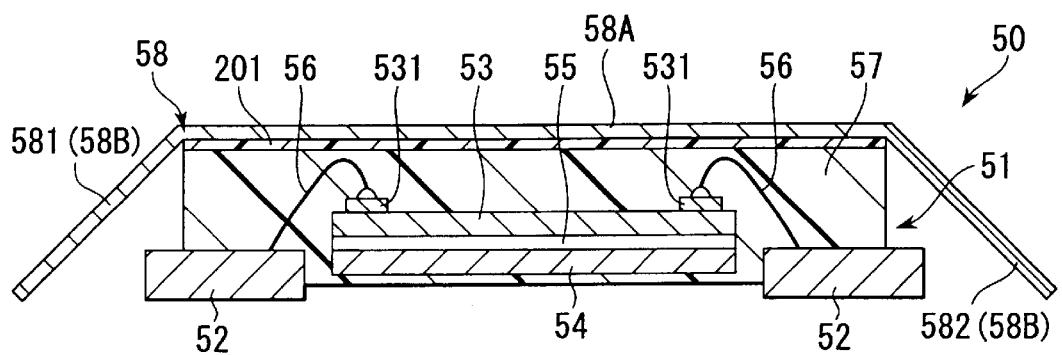
FIG. 8 is a cross sectional view showing an electronic part unit according to a fourth embodiment of the present invention.

FIG. 8 shows an electronic part unit 50 according to a fourth embodiment of the present invention. The electronic part unit 50 comprises an electronic part body 51 which is a square chip module having a structure, for example, of a QON (Quad Outline Non-lead).

In the electronic part body 51, a semiconductor chip 53 such as an integrated circuit is bonded to a substrate 54 called, for example, an island by a die bonding past 55, and a plurality of electrodes 531 on the semiconductor chip 53 are electrically connected by bonding wires 56 to a plurality of external connection electrodes 52 arranged in a predetermined pitch. The electronic part body 51 is obtained by encapsulating the semiconductor chip 53 and the substrate 54 with a resin material 57 such that the external connection electrodes 52 are partially projecting from the side surface as shown in FIG. 8.

The electronic part unit 50 further comprises a cover member 58 bonded to the top surface of the electronic part body 51 by an adhesive 201. The cover member 58 includes a plate section 58A covering the top surface of the electronic part body 51 and an inclined side-wall section 58B which extends downward from the plate section 58A to create a space for receiving an adhesive 202 on the two opposing sides of the electronic part body 51 and to seal the adhesive 202 in the space. The side-wall section 58B has first and second sealing plates 581 and 582 which are set at a predetermined inclination angle with respect to the plate section 58A and cover all the external connection electrodes 52 projecting and arranged along the two opposing sides of the electronic part body 51.

Figure 9:
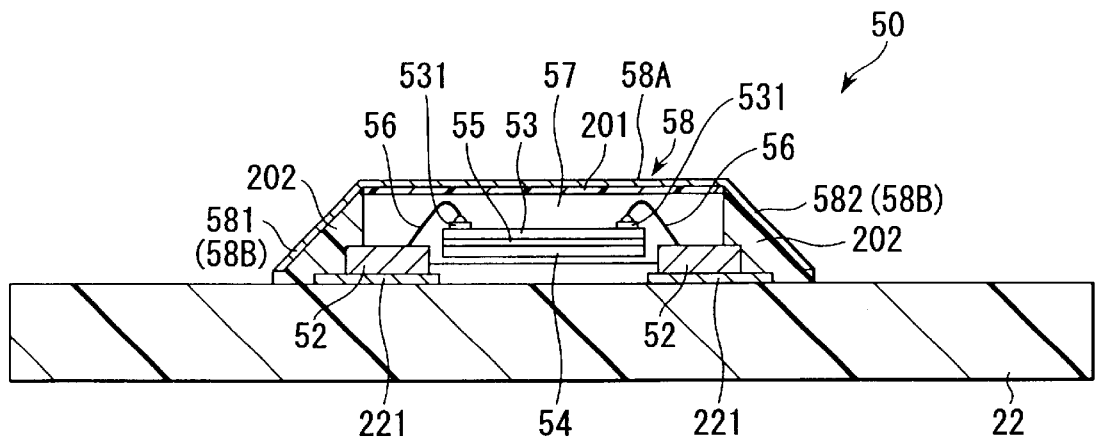
FIG. 9 is a cross sectional view showing a circuit board apparatus having the electronic part unit shown in FIG. 8 mounted thereon.
Figure 10:
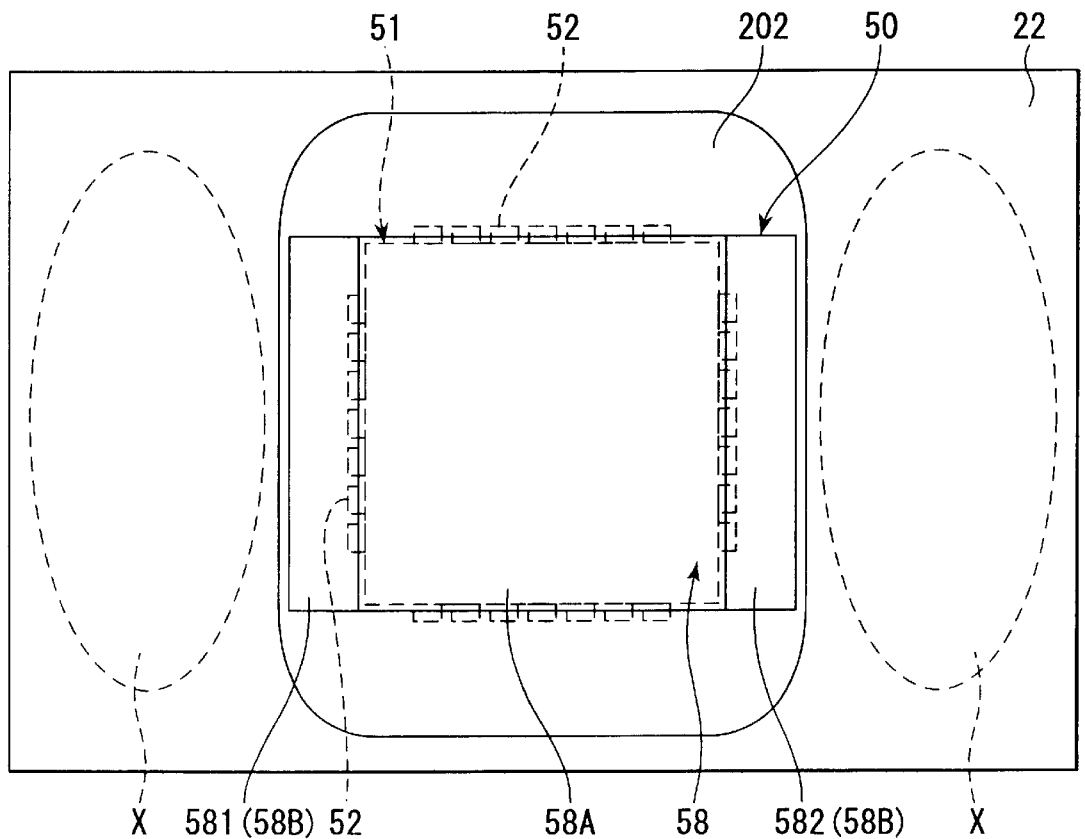
FIG. 10 is a plan view showing the outer appearance of the circuit board apparatus shown in FIG. 9.
Figure 11:
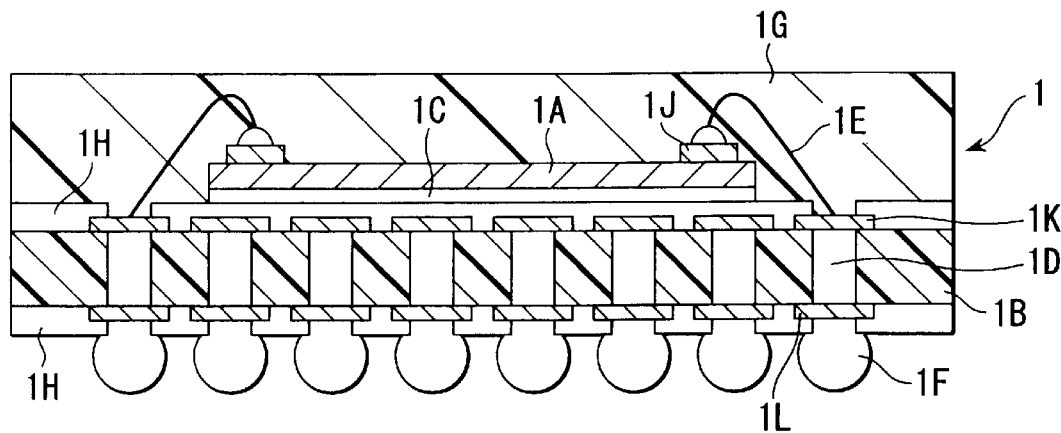
FIG. 11 is a cross sectional view showing the conventional electronic part unit.
Figure 12:
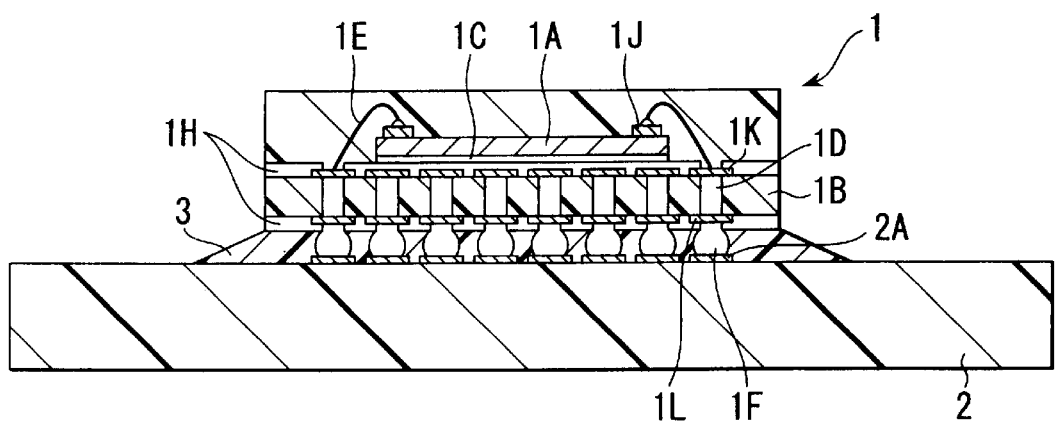
FIG. 12 is a cross sectional view showing the circuit board apparatus having the electronic part unit shown in FIG. 11 mounted thereon.

As shown in FIGS. 9 and 10, the electronic part unit 50 described above is mounted on the printed circuit board 22 in a state where the cover member 58 and the electronic part body 51 are assembled in one module. That is, the electronic part unit 50 is placed on the printed circuit board 22 in an orientation that the sealing plates 581 and 582 neighbor regions X which should be protected from attachment of the adhesive 202. Then, the electronic part unit 50 is mounted by a soldering in which the electrodes 52 are connected to desired connection electrodes 221 of the printed circuit board 22. Under this condition, an adhesive 202 formed of, for example, an epoxy resin is loaded to those two opposing sides of the mounting surface of the electronic part body 51 which are not covered by the sealing plates 581 and 582. Thus, the adhesive 202 is filled in the space between the electronic part body 51 and the printed circuit board 22, and also in the space defined by the sealing plates 581 and 582 of the cover member 58, the side surface of the electronic part body 51 and the printed circuit board 22 so as to bond the electronic part body 51 and the cover member 58 to the printed circuit board 22.

In the fourth embodiment, the electronic part unit 50 is mounted on the printed circuit board 22 as described above. In this state, the adhesive 202 is sealed in the spaces defined by the sealing plates 581 and 582 so as not to leak into regions X of the printed circuit board 22. Therefore, the regions X of the printed circuit board 22 are available for mounting electronic parts such as connectors and the like which should be protected from attachment of the adhesive 202. Further, the density of electronic parts on the printed circuit board 22 can be improved by sufficiently reducing the distance of the electronic part unit 50 from the regions X.

In the fourth embodiment described above, the sealing plates 581 and 582 of the cover member 58 are formed to prevent leakage of the adhesive 202 toward the regions X neighboring two sides of the electronic part unit 50. However, the present invention is not limited to the particular construction. Specifically, the cover member 58 may be configured to prevent leakage of the adhesive 202 from at least one side of the electronic part unit 50 or from a desired range of the at least one side of the electronic part unit 50.

Further, the fourth embodiment describes the case where the electronic part body 50 is of the QON structure. The cover member 58 is not only applicable to the QON structure, but also applicable to a structure in which the external connection electrodes are arranged only in the side surface of an electronic part body.

In addition, each of the first to third embodiments describes the case where the electronic part body is of the BGA structure. However, the present invention is not limited to the particular structure. Thus, the BGA structure may be replaced by the QON structure used in the fourth embodiment.

As described above, the present invention is not limited to the embodiments described above and can be variously modified for practical use within the technical scope of the present invention. Further, elements disclosed in the embodiments described above are selectively combinable according to various aspect of the invention.

For example, some of the elements disclosed in the embodiments described above may be excluded, if they are not relevant to the problem or effect set forth for each aspect of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic part unit mounted on a printed circuit board, comprising:

an electronic part body which has a carrier substrate containing first and second surfaces opposed to each other, a semiconductor chip bonded to the first surface of the carrier substrate, and a plurality of external connection electrodes formed on the second surface of the carrier substrate and electrically connected to said semiconductor chip and in which said semiconductor chip is encapsulated such that said external connection electrodes remain exposed in a bottom surface of said electronic part body serving as a mounting surface opposed to said printed circuit board; and a cover member covering said electronic part body except for the mounting surface;

said cover member having a shape defining a space which receives an adhesive around a side surface of the electronic part body and surrounding said external connections electrodes to bond said electronic part body and said cover member to said printed circuit board, wherein said cover member increases the bonding strength between said electronic part body and said printed circuit board.

2. The electronic part unit according to claim 1, wherein said cover member includes a plate section covering the top surface of said electronic part body and a side-wall section extending downward from said plate section along the side surface of said electronic part body.

3. The electronic part unit according to claim 2, wherein said cover member is integrated with said electronic part body such that a space to be filled with the adhesive is created between the cover member and the top and side surfaces of said electronic part body.

4. The electronic part unit according to claim 3, wherein said side-wall section surrounds the side surface of said electronic part body, and said plate section has an air hole which releases air contained in the space created between said cover member and said electronic part body.

5. The electronic part unit according to claim 1, wherein said electronic part body is formed in a multi-sided form, and said cover member includes a plate section covering the top surface of said electronic part body and a side-wall section extending downward from said plate section to create a space for receiving the adhesive on at least one side of said electronic part body and to seal the adhesive in the created space.

6. A circuit board apparatus comprising:
a printed circuit board;
an electronic part body which has a carrier substrate containing first and second surfaces opposed each other, a semiconductor chip bonded to the first surface of the carrier substrate, and a plurality of external connection electrodes formed on the second surface of the carrier substrate and electrically connected to said semiconductor chip and which is mounted on said printed circuit board, and in which said semiconductor chip is encapsulated such that said external connection electrodes remain exposed in a bottom surface of said electronic part body serving as a mounting surface opposed to said printed circuit board;
a cover member covering said electronic part body except for the mounting surface; and
an adhesive received in a space which is defined around a side surface of said electronic part body by the shape of said cover member and surrounding said external connections electrodes to bond said electronic part body and said cover member to said printed circuit board, wherein said cover member increases the bonding strength between said electronic part body and said printed circuit board.

7. The circuit board apparatus according to claim 6, wherein said external connection electrodes are connected to said printed circuit board by solder bumps, and said adhesive is filled in a space created between said electronic part body and said printed circuit board according to a thickness of the solder bumps.

8. The circuit board apparatus according to claim 7, wherein said electronic part body is formed in a multi-sided form, and said external connection electrodes are arranged along sides of the mounting surface of said electronic part body.

9. The circuit board apparatus according to claim 6, wherein said electronic part body is formed in a square chip module, said external connection electrodes are arranged along at least two opposing sides of the mounting surface of said electronic part body and partially projecting from the side surface of the electronic part body, separated from each other, and said cover member includes a plate section covering the top surface of said electronic part body and an inclined side-wall section extending downward from said plate section to create a space for receiving the adhesive on at least two opposing sides of said electronic part body and to seal the adhesive in the created space.

10. The circuit board apparatus according to claim 6, wherein said cover member includes a plate section covering the top surface of said electronic part body and a side-wall section extending downward from said plate section along the side surface of said electronic part body, and said adhesive is received in a space defined by a rim of said cover member, the side surface of said electronic part body and said printed circuit board.

11. The circuit board apparatus according to claim 10, wherein said cover member is integrated with said electronic part body such that a space to be filled with the adhesive is created between the cover member and the top and side surfaces of said electronic part body.

12. The circuit board apparatus according to claim 11, wherein said side-wall section surrounds the side surface of said electronic part body, and said plate section has an air hole which releases air contained in the space created between said cover member and said electronic part body.

13. An electronic part unit mounted on a printed circuit board, comprising:
an electronic part body which has a semiconductor chip and a plurality of external connection electrodes electrically connected to said semiconductor chip and in which said semiconductor chip is encapsulated such that said external connection electrodes project from said electronic part body and remain exposed in a bottom surface of said electronic part body serving as a mounting surface opposed to said printed circuit board; and
a cover member covering said electronic part body except for the mounting surface;
said cover member having a shape defining a space which is positioned around a side surface of the electronic part body and receives part of an adhesive applied to surround said external connection electrodes and bond said electronic part body and said cover member to said printed circuit board, wherein said cover member increases the bonding strength between said electronic part body and said printed circuit board.

14. The electronic part unit according to claim 13, wherein said cover member includes a plate section covering the top surface of said electronic part body and a side-wall section extending downward from said plate section along the side surface of said electronic part body.

15. The electronic part unit according to claim 14, wherein said cover member is integrated with said electronic part body such that a space to be filled with the adhesive is created between the cover member and the top and side surface of said electronic part body.

16. The electronic part unit according to claim 15, wherein said side-wall section surrounds the side surface of said electronic part body, and said plate section has an air hole which releases air contained in the space created between said cover member and said electronic part body.

17. The electronic part unit according to claim 13, wherein said electronic part body is formed in a multi-sided form, and said cover member includes a plate section covering the top surface of said electronic part body and a side-wall section extending downward from said plate section to create a space for receiving the adhesive on at least one side of said electronic part body and to seal the adhesive in the created space.

18. A circuit board apparatus comprising:

a printed circuit board;

an electronic part body which has a semiconductor chip and a plurality of external connection electrodes electrically connected to said semiconductor chip and which is mounted on said printed circuit board, and in which said semiconductor chip is encapsulated such that said external connection electrodes project from said electronic part body and remain exposed in a bottom surface of said electronic part body serving as a mounting surface opposed to said printed circuit board;

a cover member covering said electronic part body except for the mounting surface; and an adhesive which is applied to surround said external connection electrodes and bond said electronic part body and said cover member to said printed circuit board, and part of which is received in a space defined to be positioned around a side surface of said electronic part body by the shape of said cover member, wherein said cover member increases the bonding strength between said electronic part body and said printed circuit board.

19. The circuit board apparatus according to claim 18, wherein said external connection electrodes are connected to said printed circuit board by solder bumps, and said adhesive is filled in a space created between said electronic part body and said printed circuit board according to a thickness of the solder bumps.

20. The circuit board apparatus according to claim 19, wherein said electronic part body is formed in a multi-sided form, and said external connection electrodes are arranged along sides of the mounting surface of said electronic part body and separated from each other.

21. The circuit board apparatus according to claim 18, wherein said electronic part body is formed in a square chip module, said external connection electrodes are arranged along at least two opposing sides of the mounting surface of said electronic part body, separated from each other, and partially projecting from the side surface of the electronic part body, and said cover member includes a plate section covering the top surface of said electronic part body and an inclined side-wall section extending downward from said plate section to create a space for receiving the adhesive on at least two opposing sides of said electronic part body and to seal the adhesive in the created space.

22. The circuit board apparatus according to claim 18, wherein said cover member includes a plate section covering the top surface of said electronic part body and a side-wall section extending downward from said plate section along the side surface of said electronic part body, and said adhesive is received in a space defined by a rim of said cover member, the side surface of said electronic part body and said printed circuit board.

23. The circuit board apparatus according to claim 22, wherein said cover member is integrated with said electronic part body such that a space to be filled with the adhesive is created between the cover member and the top and side surfaces of said electronic part body.

24. The circuit board apparatus according to claim 23, wherein said side-wall section surrounds the side surface of said electronic part body, and said plate section has an air hole which releases air contained in the space created between said cover member and said electronic part body.

* * * * *